(12) United States Patent
Nakanishi et al.

(10) Patent No.: US 12,203,969 B2
(45) Date of Patent: Jan. 21, 2025

(54) ELECTROSTATIC WITHSTAND VOLTAGE TEST DEVICE AND ELECTROSTATIC WITHSTAND VOLTAGE TEST METHOD

(71) Applicant: Mitsubishi Electric Corporation, Tokyo (JP)

(72) Inventors: Kohei Nakanishi, Tokyo (JP); Masao Kanatani, Tokyo (JP); Shinichiro Ando, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 121 days.

(21) Appl. No.: 18/000,702

(22) PCT Filed: Jun. 30, 2021

(86) PCT No.: PCT/JP2021/024800
§ 371 (c)(1),
(2) Date: Dec. 5, 2022

(87) PCT Pub. No.: WO2022/004804
PCT Pub. Date: Jan. 6, 2022

(65) Prior Publication Data
US 2023/0213567 A1     Jul. 6, 2023

(30) Foreign Application Priority Data
Jul. 3, 2020   (JP) ................ 2020-115582

(51) Int. Cl.
*G01R 31/00*    (2006.01)
*G01R 29/12*    (2006.01)
*G01R 31/319*   (2006.01)

(52) U.S. Cl.
CPC ................ *G01R 31/002* (2013.01)

(58) Field of Classification Search
CPC ..... G01R 31/319; G01R 31/002; G01R 29/12
See application file for complete search history.

(56) References Cited

U.S. PATENT DOCUMENTS

| | | | |
|---|---|---|---|
| 4,806,857 A | | 2/1989 | Inamura et al. |
| 5,315,232 A | * | 5/1994 | Stewart .......... G01R 29/12 |
| | | | 324/72 |

(Continued)

FOREIGN PATENT DOCUMENTS

| | | |
|---|---|---|
| JP | S62239069 A | 10/1987 |
| JP | 2000206177 A | 7/2000 |

(Continued)

OTHER PUBLICATIONS

International Search Report (PCT/ISA/210) with English translation and Written Opinion (PCT/ISA/237) mailed on Sep. 21, 2021, by the Japan Patent Office as the International Searching Authority for International Application No. PCT/JP2021/024800.

*Primary Examiner* — Jermele M Hollington
*Assistant Examiner* — Temilade S Rhodes-Vivour
(74) *Attorney, Agent, or Firm* — Buchanan Ingersoll & Rooney PC

(57) ABSTRACT

A mount board has a plurality of terminals electrically connected to a plurality of pins of a semiconductor device, and a conductor pattern. An electrostatic withstand voltage test device includes a metal plate on which the mount board is installed, a power supply for applying a voltage to the metal plate, an insulator disposed between the metal plate and the mount board, a switch circuit connected between the terminals and ground wiring, and a controller for controlling the switch circuit. The switch circuit includes a plurality of first switches provided corresponding to the terminals and each connecting a corresponding terminal to the ground wiring. The controller turns on at least one first switch selected from the first switches when an electric charge stored in the conductor pattern is discharged to the ground wiring through the semiconductor device.

10 Claims, 13 Drawing Sheets

(56) References Cited

U.S. PATENT DOCUMENTS

| | | | | |
|---|---|---|---|---|
| 2002/0186016 A1* | 12/2002 | Kodama | ................ | G01R 29/12 |
| | | | | 324/457 |
| 2006/0157703 A1* | 7/2006 | Kodama | .............. | G01R 31/002 |
| | | | | 257/48 |
| 2017/0176508 A1* | 6/2017 | Song | .................... | G01R 31/002 |
| 2018/0067156 A1* | 3/2018 | Watkins | ............. | G01R 31/2887 |

FOREIGN PATENT DOCUMENTS

| JP | 2001091572 A | 4/2001 |
|---|---|---|
| JP | 2006317432 A | 11/2006 |
| JP | 2016095272 A | 5/2016 |

* cited by examiner

ELECTROSTATIC WITHSTAND VOLTAGE TEST DEVICE AND ELECTROSTATIC WITHSTAND VOLTAGE TEST METHOD

TECHNICAL FIELD

The present disclosure relates to an electrostatic withstand voltage test device and an electrostatic withstand voltage test method.

BACKGROUND ART

With miniaturization of semiconductor devices such as integrated circuits and discrete devices, the risk of failures due to electrostatic discharge has been increasing. In the application of semiconductor devices, electrostatic control is required which grasps the degree of withstand voltage against electrostatic discharge and prevents failures in accordance with the withstand voltage. Every semiconductor device therefore undergoes an electrostatic withstand voltage test (for example, see Japanese Patent Laying-Open No. 2000-206177 (PTL 1)).

CITATION LIST

Patent Literature

PTL 1: Japanese Patent Laying-Open No. 2000-206177

SUMMARY OF INVENTION

Technical Problem

In conventional electrostatic withstand voltage testing, an electrostatic discharge is caused for one terminal of a semiconductor device. However, even when an electrostatic discharge is caused for one terminal, the semiconductor device sometimes does not fail with a voltage produced in the manufacturing field.

In a configuration in which a connector is inserted into a plurality of pins provided on a board populated with a semiconductor device, the terminals of the pins are electrically brought into contact with a plurality of terminals of the semiconductor device simultaneously. In such a configuration, since an electrostatic discharge is caused in the semiconductor device through a plurality of pins, a large current can be fed to the semiconductor device in a short time, compared with a configuration in which an electrostatic discharge is caused in the semiconductor device through one pin. As a result, the possibility that the semiconductor device is failed is increased. In the conventional electrostatic withstand voltage testing in which an electrostatic discharge is caused at one terminal, the withstand voltage a the semiconductor device sometimes fail to be accurately measured in the manufacturing field.

The present disclosure is made to solve such a problem and an object of the present disclosure is to provide art electrostatic withstand voltage test device and an electrostatic withstand voltage test method capable of accurately measure the electrostatic withstand voltage of a semiconductor device on a mount board.

Solution to Problem

In an aspect of the present disclosure, an electrostatic withstand voltage test device measures an electrostatic withstand voltage of a semiconductor device on a mount board. The semiconductor device has a plurality of pins. The mount board has a plurality of terminals electrically connected to the pins, respectively, and a conductor pattern. The electrostatic withstand voltage test device includes a metal plate on which the mount board is installed, a power supply to apply a voltage to the metal plate, an insulator disposed between the metal plate and the mount board, a switch circuit connected between the terminals and ground wiring, and a controller to control the switch circuit. The switch circuit includes a plurality of first switches provided corresponding to the terminals and each connecting a corresponding terminal to the ground wiring. The controller turns on at least one first switch selected from the first switches when an electric charge stored in the conductor pattern is discharged to the ground wiring through the semiconductor device.

In another aspect of the present disclosure, an electrostatic withstand voltage test method is an electrostatic withstand voltage test method for measuring an electrostatic withstand voltage of a semiconductor device on a mount board. The semiconductor device has a plurality of pins. The mount board has a plurality of terminals electrically connect to the pins, respectively, and a conductor pattern. The electrostatic withstand voltage test method includes causing an electrostatic discharge in the semiconductor device. The causing an electrostatic discharge in the semiconductor device includes charging the conductor pattern by applying a voltage to a metal plate disposed to be opposed to the conductor pattern with an insulator interposed, and discharging an electric charge stored in the conductor pattern to ground wiring through the semiconductor device. The discharging includes turning on at least one first switch selected from a plurality of first switches provided corresponding to the terminals and each connecting a corresponding terminal to the ground wiring.

Advantageous Effects of Invention

The present disclosure can provide an electrostatic withstand voltage test device and an electrostatic withstand voltage test method capable of accurately measuring the electrostatic withstand voltage of a semiconductor device in the manufacturing field.

DESCRIPTION OF EMBODIMENTS

Figure 1:
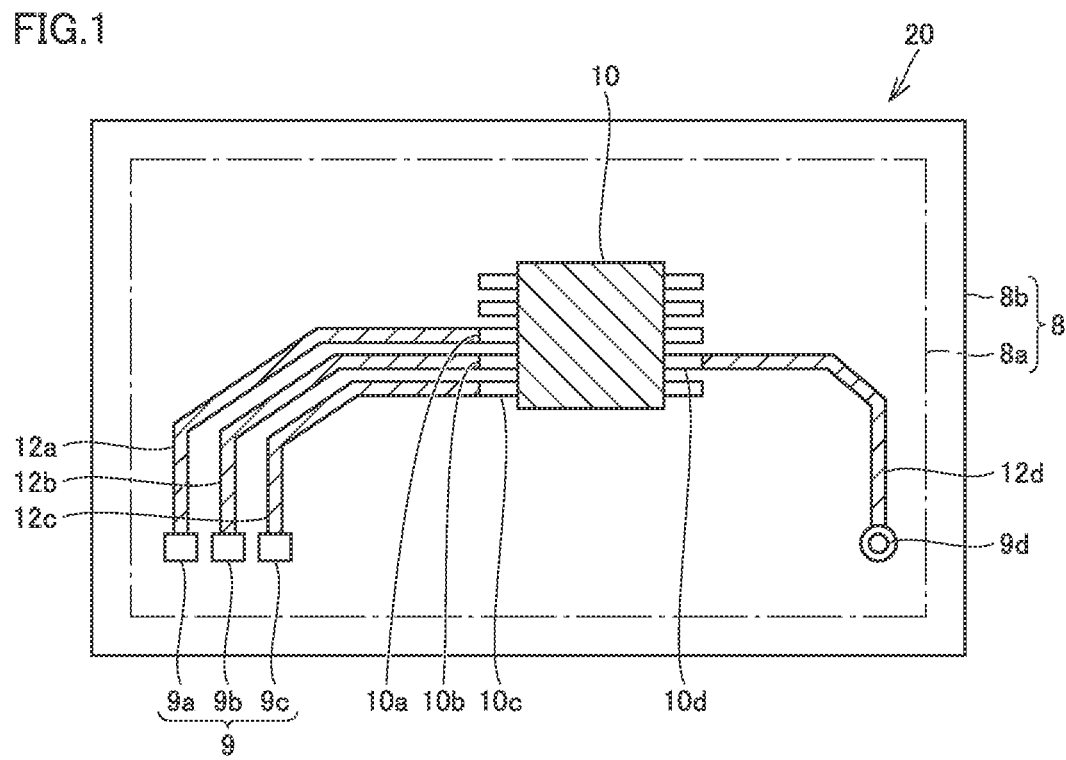
FIG. 1 is a partially enlarged plan view of a semiconductor apparatus.

Embodiments of the present disclosure will be described in detail below with reference to the drawings. In the following, like or corresponding parts in the drawings are denoted by like reference signs and a description thereof is basically not repeated.

First Embodiment (Configuration Example of Semiconductor Apparatus)

Figure 2:
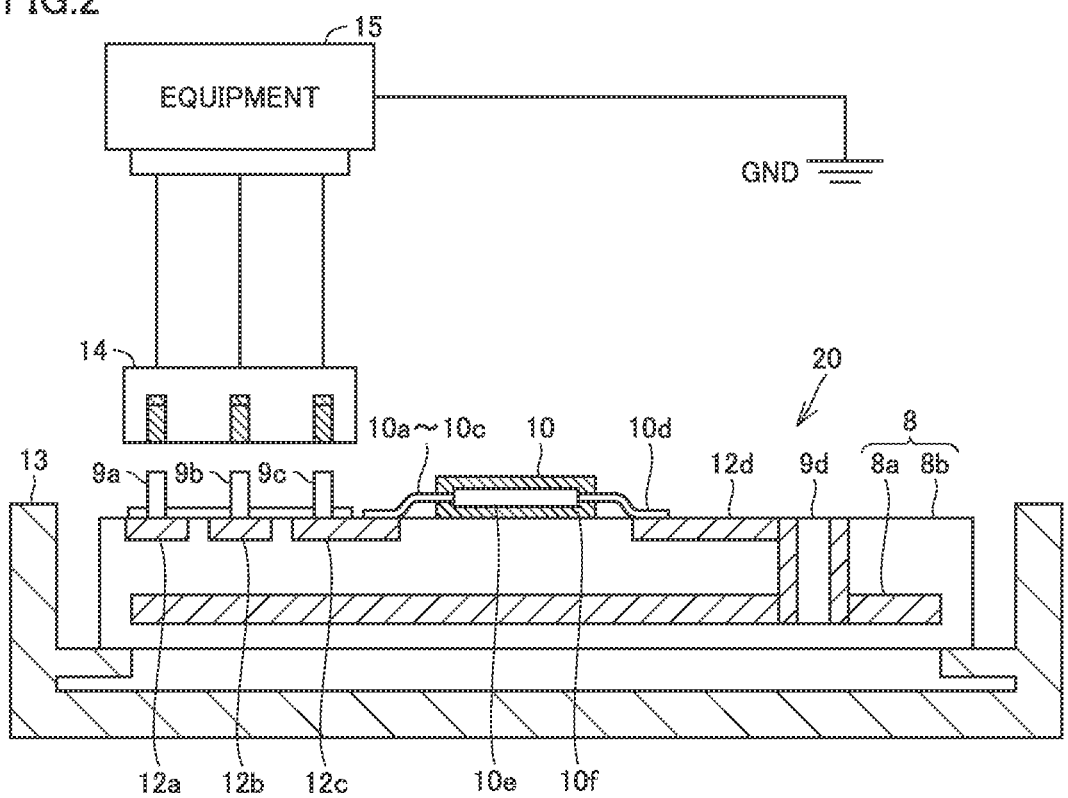
FIG. 2 is a cross-sectional view of the semiconductor apparatus.

First of all, referring to FIG. 1 and FIG. 2, a configuration example of a semiconductor apparatus to be tested in an electrostatic withstand voltage test method according to a first embodiment will be described. FIG. 1 is a partially enlarged plan view of a semiconductor apparatus 20. FIG. 2 is a cross-sectional view of semiconductor apparatus 20. FIG. 2 illustrates a state in which semiconductor apparatus 20 is mounted on electrical equipment.

As illustrated in FIG. 1 and FIG. 2, semiconductor apparatus 20 includes a mount board 8 and a semiconductor device 10. Mount board 8 includes a conductor pattern 8a and an insulating layer 8b stacked on conductor pattern 8a. Conductor pattern 8a occupies a large area of mount board 8 in a planar view and forms a GND pattern.

Semiconductor device 10 is mounted on a surface of mount board 8. Semiconductor device 10 includes at least one semiconductor element 10e, a sealing resin 10f, and a plurality of pins. Semiconductor element 10e is composed of, for examples, an insulated gate bipolar transistor (IGBT), a metal-oxide-semiconductor field effect transistor (MOSFET), a diode, and the like.

A plurality of pins are electrically connected to at least one semiconductor element 10e through not-illustrated conductive wires. Sealing resin 10f seals at least one semiconductor element 10e and parts of a plurality of pins. Thus, the parts of a plurality of pins are exposed front scaling resin 10f. A plurality of pins include pins 10a to 10c for power feed and signal input and a GND pin 10d for ground voltage (GND) supply.

Wiring 12a to 12c for power feed and signal input, GND wiring 12d, and a plurality of terminals 9 are formed on a surface of mount board 8. A plurality of terminals 9 include terminals 9a to 9c for power feed and signal input, and a GND terminal 9d.

Wiring 12a to 12c are electrically insulated front conductor pattern 8a. GND wiring 12d is electrically connected to conductor pattern 8a through GND terminal 9d disposed in insulating layer 8b. First ends of wiring 12a to 12c are connected to pins 10a to 10c of semiconductor device 10, respectively. Second ends of wiring 12a to 12e are connected to terminals 9a to 9c, respectively. A first end of GND wiring 12d is connected to GND pin 10d of semiconductor device 10. A second end of GND wiring 12d is connected to GND terminal 9d.

In the manufacturing process of the electrical equipment, semiconductor apparatus 20 is accommodated inside a casing 13 formed of resin or the like. A connector 14 is inserted into terminals 9a to 9c of semiconductor apparatus 20 so that terminals 9a to 9c are electrically connected to another equipment 15 through connector 14.

(Electrostatic Discharge)

An electrostatic discharge that may occur in the manufacturing field of the electrical equipment will now be described in detail.

In the manufacturing field of the electrical equipment, casing 13 accommodating semiconductor apparatus 20 is charged with respect to GND, whereby conductor pattern 8a (GND pattern) provided in mount board 8 is sometimes charged. As illustrated in FIG. 2, conductor pattern 8a is electrically connected to GND pin 10d of semiconductor device 10 through GND terminal 9d and GND wiring 12d, In the manufacturing process, it is assumed that pin 10a a semiconductor device 10 is electrically connected to another equipment 15 through connector 14 with conductor pattern 8a being charged.

In this case, since pin 10a of semiconductor device 10 and terminal 9a on mount board 8 are electrically connected, upon insertion of connector 14 into terminal 9a, an electric charge stored in conductor pattern 8a flows from GND pin 10d to GND via semiconductor element 10e and pin 10a, terminal 9a, connector 14, and the wiring inside equipment 15. That is, an electrostatic discharge depending on the amount of electric charge stored in conductor pattern 8a occurs in semiconductor apparatus 20, and this may cause failure of semiconductor device 10.

One of model designed for an electrostatic discharge of a mount board is a charge board event (CBE). CBE is a model in which an electric change stored in a mount board is discharged due to insertion of a connector into the charged mount board or contact of a metal tool with the mount board. Typically, the mount board often has an area a few hundreds larger than a semiconductor device, and a large amount of electric charge is stored in the mount board in proportion to its area.

A conductive GND pattern that occupies a large area of the mount board is widely adopted as anti-noise measures in the mount board. The capacitance C that represents the capacity of electric charge stored in each of the semiconductor device and the mount board is determined based on the relational expression $C=\varepsilon(S/D)$. Here, $\varepsilon$ is a dielectric constant, S is the area of a counter electrode, and D is the distance between counter electrodes. As described above, since the GND pattern has a larger area S than the semiconductor device, the capacitance C of the mount board is larger than the capacitance C of the semiconductor device.

The amount of electric charge Q stored in each of the semiconductor device and the mount board is determined based on the relational expression $Q=CV$. Here, V as a voltage applied between counter electrodes. As described above, since the mount board has a larger capacitance C than the semiconductor device, the mount board stores a larger amount of electric charge than the semiconductor device when the applied voltages V are equal to each other.

The energy W of electrostatic discharge is determined based on the relational expression $W=Q\times V/2$. When the applied voltages V to the semiconductor device and the mount board are equal to each other, the amount of electric charge Q stored in the mount board is larger than that of the semiconductor device and therefore the energy W of electrostatic discharge is also larger. In semiconductor apparatus 20 illustrated in FIG. 1 and FIG. 2, therefore, semiconductor device 10 alone does not fail due to the electrostatic discharge, but mounting semiconductor device 10 on mount board 8 may cause a failure in semiconductor device 10 due to the electrostatic discharge. It is therefore necessary to perform an electrostatic withstand voltage test according to CBE in a state in which semiconductor device 10 is mounted on mount board 8, and to measure an electrostatic withstand voltage of semiconductor device 10 in the manufacturing process of the electrical equipment.

(Electrostatic Withstand Voltage Test)

An electrostatic withstand voltage test according to the first embodiment will now be described. First, referring to FIG. 3, a configuration example of an electrostatic withstand voltage test device according to the first embodiment will be described.

(1) Configuration Example of Electrostatic Withstand Voltage Test Device

Figure 3:
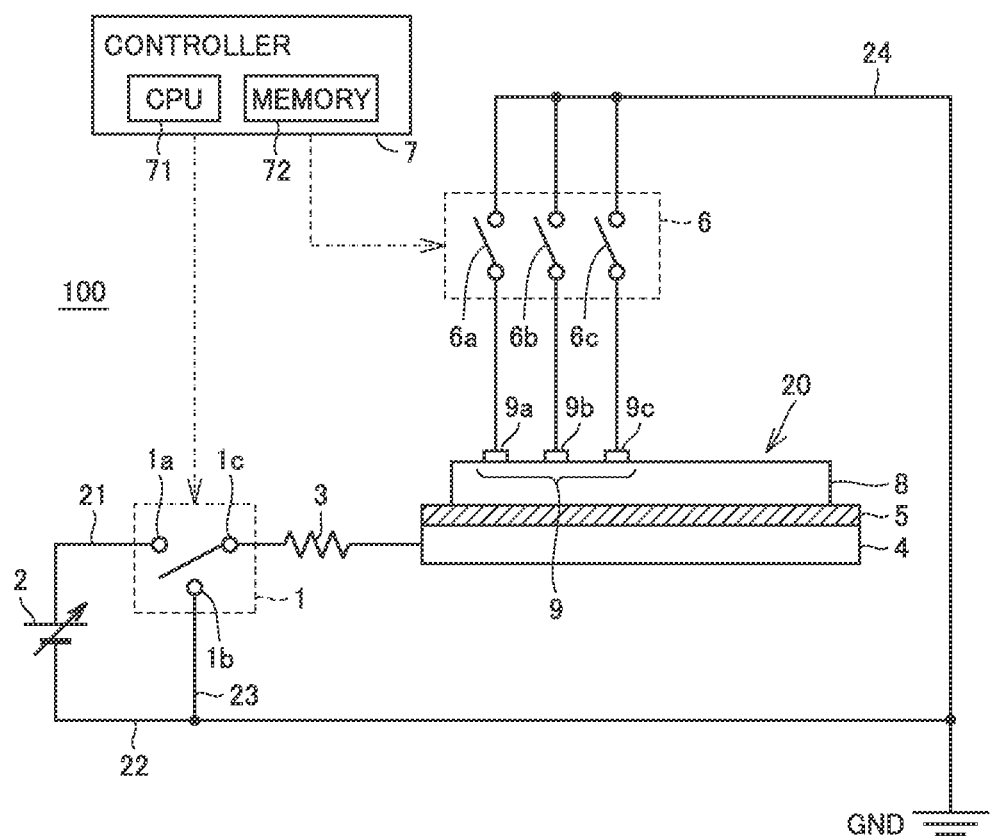
FIG. 3 is a diagram schematically illustrating a configuration example of an electrostatic withstand voltage test device according to a first embodiment.

FIG. 3 is a diagram schematically illustrating a configuration example of an electrostatic withstand voltage test device according to the first embodiment.

As illustrated in FIG. 3, an electrostatic withstand voltage test device 100 according to the first embodiment is a device for pleasuring an electrostatic withstand voltage of semiconductor apparatus 20 illustrated in FIG. 1 and FIG. 2. Electrostatic withstand voltage test device 100 includes a switch 1, a DC power supply 2, a resistor 3, a metal plate 4, an insulator 5, a switch circuit 6, a controller 7, and power lines 21 to 24.

DC power supply 2 is connected to high voltage-side power line 21 and low voltage-side power line 22. Power line 22 is composed of ground wiring. DC power supply 2 is configured such that the magnitude of voltage output to power line 21 can be changed.

Resistor 3 is connected between power line 21 and metal plate 4. Switch 1 is connected between power line 21, 23 and resistor 3. A semiconductor switch or a mechanical switch can be employed as switch 1. The semiconductor switch is typically a semiconductor switching element such as an IGBT or a MOSFET. The mechanical switch is, for example, a switch such as a relay. Switch 1 corresponds to an embodiment of "second switch".

Switch 1 is configured to electrically connect resistor 3 to one of power line 21 and power line 23 in accordance with a control signal from controller 7. As an example, switch 1 has three contacts 1a to 1c. Contacts 1a and 1b are fixed contacts, and contact 1c is a movable contact selectively connecting to contact 1a, 1b. Contact 1a is connected to a first terminal of power line 21, contact 1b is connected to a first terminal of power line 23, and contact 1c is connected to a first terminal of resistor 3. A second terminal of power line 21 is connected to the positive electrode of DC power supply 2, a second terminal of power line 23 is connected a power line 22, and a second terminal of resistor 3 is connected to metal plate 4.

Connecting contact 1c of switch 1 to contact 1a allows power line 21 and resistor 3 to be electrically connected, so that the voltage supplied from DC power supply 2 to power line 21 can be applied to metal plate 4 through resistor 3. On the other hand, connecting contact 1c of switch 1 to contact 1b allows power line 23 and resistor 3 to be electrically connected, so that the electric charge accumulated in metal plate 4 can be discharged toward power line 22 through power line 23.

In the following description, connecting contact 1c to contact 1a may be referred to as "contact 1a is turned on (electrically continuous)", and connecting contact 1c to contact 1b may be referred to as "contact 1b is turned on".

In switch 1, when contact 1a is on, contact 1b is turned off (electrically discontinuous), and when contact 1b is on, contact 1a is turned off.

Insulator 5 has a flat plate shape and is disposed on metal plate 4. Semiconductor apparatus 20 is disposed on insulator 5. Insulator 5 ensures electrical insulation between metal plate 4 and conductor pattern 8a. The provision of insulator 5 between metal plate 4 and conductor pattern 8a can replicate a capacitor with metal plate 4 and conductor pattern 8a as electrodes. Thus, when a voltage is applied to metal plate 4, an electric charge can be stored in metal plate 4. The specifications of insulator 5 need to be determined in accordance with a test voltage. This is because if insulator 5 having a dielectric strength voltage lower than the test voltage is used, an electrical breakdown may occur in insulator 5 during voltage application.

Switch circuit 6 is connected between terminal 9 of semiconductor apparatus 20 and power line 24. Power line 24 is composed of ground wiring. Switch circuit 6 includes a plurality of switches 6a to 6c. A plurality of switches 6a to 6c correspond to an embodiment of "a plurality of first switches".

For example, mercury relays can be employed as switches 6a to 6c. The mercury relays have contact portions covered with mercury. In other mechanical relays, bounce occurs, in which on/off is repeated instantaneously when the switch is turned on. Bounce does not occur in mercury relays because mercury has a high viscosity. Thus, a highly reproducible electrostatic withstand voltage test can be performed.

Switches 6a to 6c are used for reproducing an electrostatic discharge that occurs when pins 10a to 10c of semiconductor device 10 as illustrated in FIG. 2 are electrically connected to another equipment 15 through connector 14. Specifically, switch 6a is connected between terminal 9a and power line 24. Switch 6b is connected between terminal 9b and power line 24. Switch 6c is connected between terminal 9c and power line 24. Each of switches 6a to 6c turns on (electrically continuous) off (electrically discontinuous) in accordance with a control signal from controller 7 to electrically connect/cut off the corresponding terminal 9 and power line 24.

Turning on switches 6a to 6c reproduces the electrical connection between pins 10a to 10c of semiconductor device 10 and connector 14 illustrated in FIG. 2, thereby replicating the electrostatic discharge due to CBE (charge board event) described above. In the example in FIG. 3, switch circuit 6 includes three switches, but the number of switches may be any number more than one.

Controller 7 controls the on/off of switch 1 and switch circuit 6. Controller 7 can be composed of, for example, a microcomputer. Specifically, controller 7 includes a central processing unit (CPU) 71 and a memory 72 for storing a program and data and can perform a control operation described later by software processing by CPU 71 executing the program. Alternatively, the control operation may be implemented partially or entirely by hardware processing using an embedded dedicated electronic circuit or the like, in place of the software processing.

Memory 72 includes a read only memory (ROM) and a random access memory (RAM). The ROM can store a program to be executed by CPU 71. The RAM can temporarily store data used during execution of the program in CPU 71 and can function as a temporary data memory used as a work area.

Controller 7 can control the on/off of a plurality of switches 6a to 6c included in switch circuit 6, independently of each other. Controller 7 therefore can turn on any one of a plurality of switches 6a to 6c. Alternatively, controller 7 can turn on two or more switches simultaneously. That is, controller 7 can turn on at least one of a plurality of switches 6a to 6c.

Figure 4:
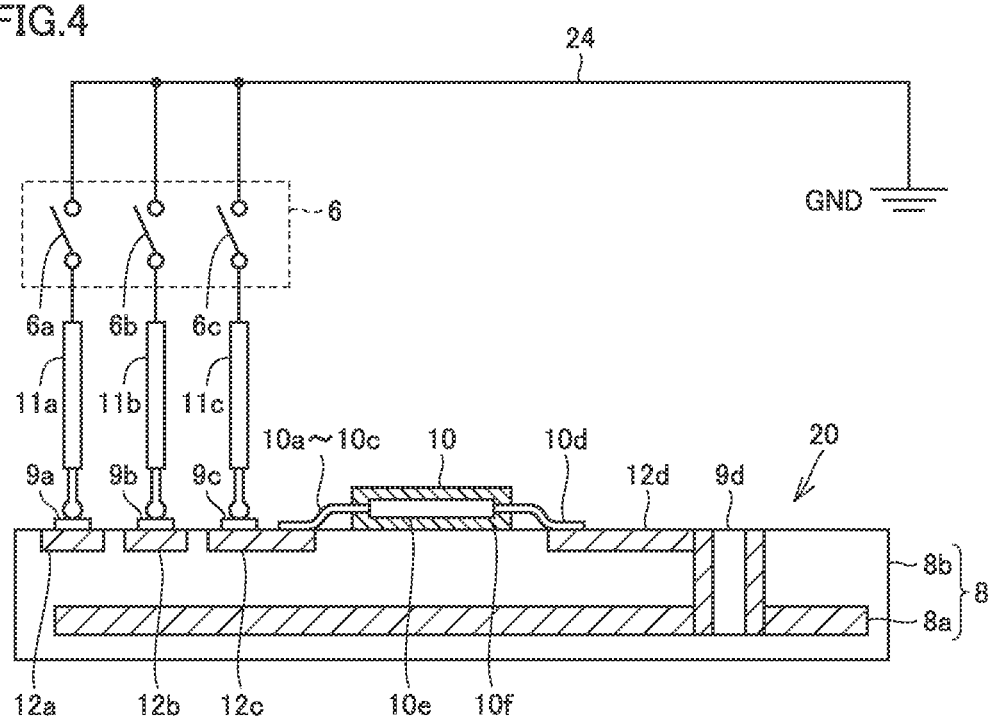
FIG. 4 is a diagram illustrating a wiring configuration of the semiconductor apparatus, a switch circuit, and a power line illustrated in FIG. 3.

FIG. 4 is a diagram illustrating a wiring configuration of semiconductor apparatus 20, switch circuit 6, and power line 24 illustrated in FIG. 3. As illustrated in FIG. 4, electrostatic withstand voltage test device 100 further includes a plurality of probes 11a to 11c. Hereinafter, probes 11a to 11c may be collectively referred to simply as "probe 11".

For example, a spring probe can be employed as probe 11. The spring probe has a movable part containing a spring, and when a pressure is applied to the tip end thereof, the spring allows the movable part to slide. Using this sliding, the contact between probe 11 and terminal 9 can be ensured.

The first terminals of probes 11a to 11c are connected to the first terminals of switches 6a to 6c, respectively. The second terminals of switches 6a to 6c are connected to power line 24. The second terminals of probes 11a to 11c are connected to a plurality of terminals 9a to 9c of semiconductor apparatus 20, respectively. In the example in FIG. 4, the number of probes 11 is three, but the number of probes 11 is any number as long as it is equal to the number of switches of switch circuit 6.

(2) Electrostatic Withstand Voltage Test Method

An electrostatic withstand voltage test method according to the first embodiment will now be described.

The electrostatic withstand voltage test method according to the first embodiment is configured such that the on/off of switch 1 and switch circuit 6 is controlled in electrostatic withstand voltage test device 100 illustrated in FIG. 3 so that charging of conductor pattern 8a of mount board 8 discharging of the electric charge accumulated in conductor pattern 8a are performed. Thus, electrostatic withstand voltage test that replicates an electrostatic discharge due to charge board event (CBE) is implemented.

(2-1) Step of Charging Conductor Pattern 8a

Figure 5:
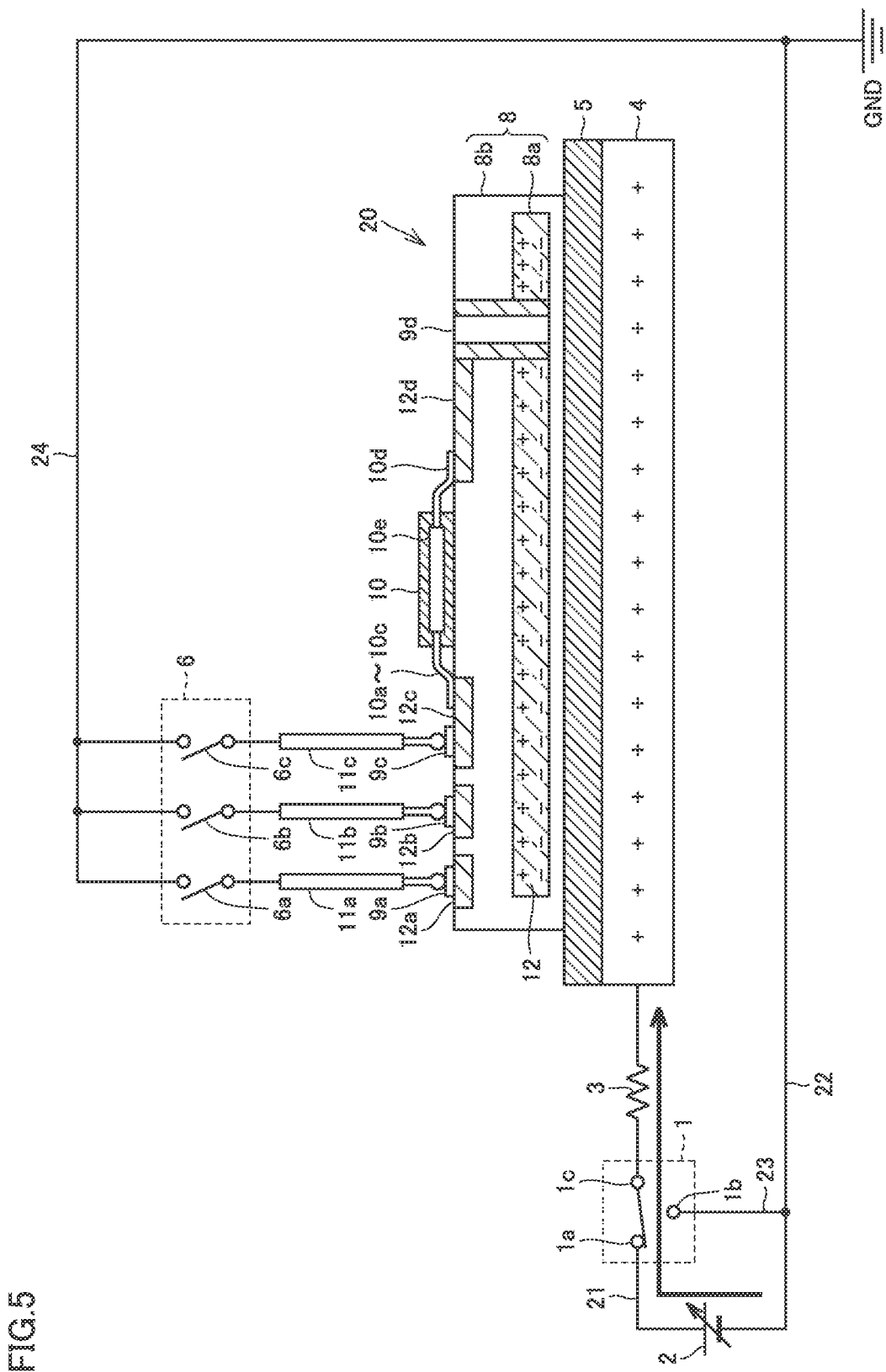
FIG. 5 is a diagram for explaining the step of charging a conductor pattern.

In the electrostatic withstand voltage test method according to the first embodiment, first, the step of charging conductor pattern 8a of mount board 8 is performed in order to cause an electrostatic discharge due to CBE. FIG. 5 is a diagram for explaining the step of charging conductor pattern 8a.

In this step, first, electrostatic withstand voltage test device 100 illustrated in FIG. 3 is set to an initial state. In the initial state, contact 1b of switch 1 is on (that is, contact 1a is off), and switches 6a to 6c of switch circuit 6 are off. Then, semiconductor apparatus 20 to be tested is set in electrostatic withstand voltage test device 100 in the initial state. That is, mount board 8 is set on insulator 5.

Then, probes 11a to 11c are operated using a not-illustrated driver so that probes 11a to 11c are brought into contact with terminals 9a to 9c of semiconductor apparatus 20, respectively, as illustrated in FIG. 5. When in contact with probes 11a to 11c, terminals 9a to 9c are electrically connected to the first terminal of switches 6a to 6c, respectively. However, since switches 6a to 6c all are in the off state, terminals 9a to 9c are electrically cut off from power line 24 (that is, GND).

Then, as illustrated in FIG. 5, contact 1a of switch 1 is turned on (that is, contact 1b is off). When contact 1a is turned on, as indicated by the arrow in the drawing, a voltage supplied from DC power supply 2 to power line 21 is applied to metal plate 4 through switch 1 and resistor 3. Thus, a positive charge is stored in metal plate 4. In the example in FIG. 5, metal plate 4 stores a positive charge. However, a negative charge may be stored to perform a test that reproduces a state in which mount board 8 is negatively charged.

Resistor 3 is provided for limiting a rush current when a voltage is applied to metal plate 4. Resistor 3 has a resistance value of a few MΩ. The installation of resistor 3 can reduce the current capacity of DC power supply 2, leading to miniaturization of DC power supply 2.

Conductor pattern 8a opposed to metal plate 4 with insulator 5 interposed is electrically neutral in the initial state of electrostatic withstand voltage test device 100 and therefore a positive charge and a negative charge are present in an equal amount. When contact 1a is turned on and a voltage is applied to metal plate 4, polarization occurs as illustrated in FIG. 5, because conductor pattern 8a has no path through which the electric charge flows out. Although polarization occurs, a positive charge and a negative charge present in conductor pattern 8a are kept in equal amount. Since the polarization causes electric charge 12 of conductor pattern 8a to produce a line of electrical force with respect to GND, conductor pattern 8a has a potential with respect to GND.

(2-2) Step of Discharging Electric Charge of Conductor Pattern 8a

Figure 6:
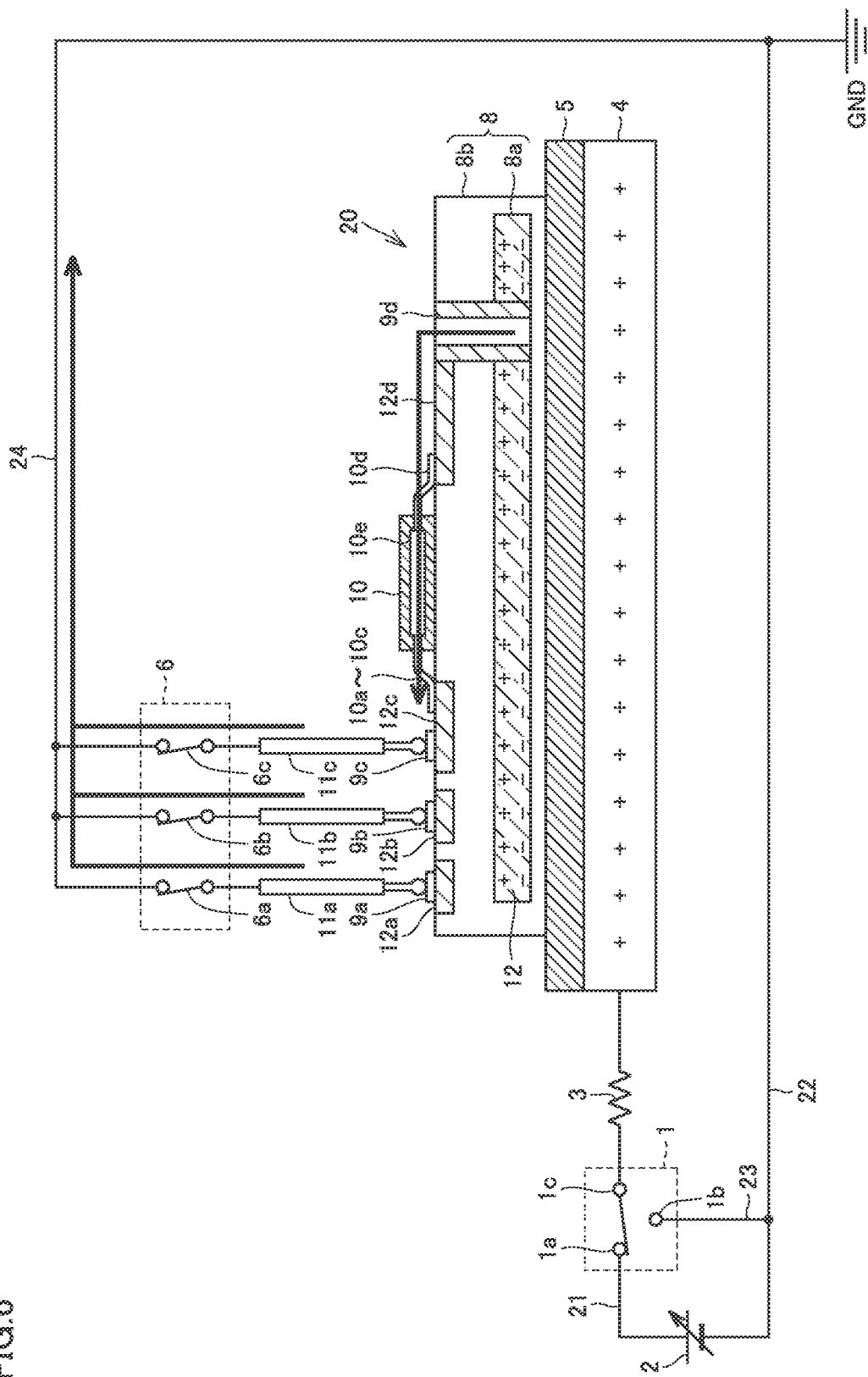
FIG. 6 is a diagram for explaining the step of discharging an electric charge of the conductor pattern.

Next, the step of discharging the electric charge stored in conductor pattern 8a is performed. In this step, electric charge 12 stored in conductor pattern 8a is discharged to GND through semiconductor device 10 to reproduce an electrostatic discharge due to CBE. FIG. 6 is a diagram for explaining the step of discharging electric charge 12 of conductor pattern 8a.

In this step, while contact 1a of switch 1 is kept in the on state, at least one of switches 6a to 6c of switch circuit 6 is turned on. In the example in FIG. 6, switches 6a to 6c are turned on simultaneously. Turning on switch 6a allows pin 10a of semiconductor device 10 to be electrically connected to GND through terminal 9a, probe 11a, switch 6a, and power line 24. Similarly, turning on switches 6b and 6c allows pins 10b and 10c of semiconductor device 10 to be electrically connected to GND.

A plurality of pins 10a to 10c of semiconductor device 10 are electrically connected to GND simultaneously, whereby, as illustrated by the arrow in FIG. 6, an electrical path via semiconductor device 10 is formed between conductor pattern 8a and GND. This electrical path is split into a plurality of electrical paths at the section from pins 10a to 10c to GND. Electric charge 12 stored in conductor pattern 8a flows into semiconductor device 10 and flows into GND through these electrical paths.

In this way, when two or more switches among a plurality of switches 6a to 6c that constitute switch circuit 6 are turned on simultaneously, a plurality of electrical paths are formed between the pins of semiconductor device 10 and GND and, therefore, the impedance of the entire discharge path of electric charge 12 of conductor pattern 8a can be reduced, compared with when only a single switch is turned on. The reduction of impedance increases the current flowing through the discharge path. However, since GND pin 10d of semiconductor device 10 allows all of the current to flow with a single terminal, the current increases beyond a permissible value to cause electrostatic breakdown.

The impedance of the entire discharge path can be changed by adjusting the number of switches turned on in switch circuit 6. As the number of switches turned on increases, the impedance of the entire discharge path decreases. As a result, the current flowing through the discharge path increases. As illustrated in FIG. 2, in the manufacturing field, each time connector 14 is inserted into a plurality of terminals 9, the manner of contact of each terminal 9 changes. It is therefore necessary to measure an electrostatic withstand voltage when the manner of contact with terminals 9 changes.

In electrostatic withstand voltage test device 100 according to the first embodiment, since the path of electrostatic discharge is controlled by switch circuit 6, an electrostatic discharge can be caused at terminal 9 selected among a plurality of terminals 9a to 9c. That is, since switches 6a to 6c and pins 10a to 10c of semiconductor device 10 are connected in one-to-one correspondence, an electrostatic discharge can be caused only at the selected terminal 9. With this, the electrostatic withstand voltage can be measured based on change in manner of contact of each terminal 9 when connector 14 is inserted into a plurality of terminals 9a to 9c.

When an electrostatic withstand voltage test is carried out using, for example, connector 14 rather than switch circuit 6, there may be various influences such as surrounding environment (humidity, etc.), the speed of inserting connector 14 and the angle of insertion, and contamination of connector 14. Therefore, even when an electrostatic withstand voltage test is carried out under the same measurement conditions, a reproducible test result sometimes fails to be obtained. On the other hand, electrostatic withstand voltage test device 100 according to the first embodiment uses switch circuit 6 to form a discharge path therefore suppresses the influences such as surrounding environment described above, and consequently can perform a highly reproducible electrostatic withstand voltage test.

(2-3) Step of Removing Electricity of Metal Plate 4

Figure 7:
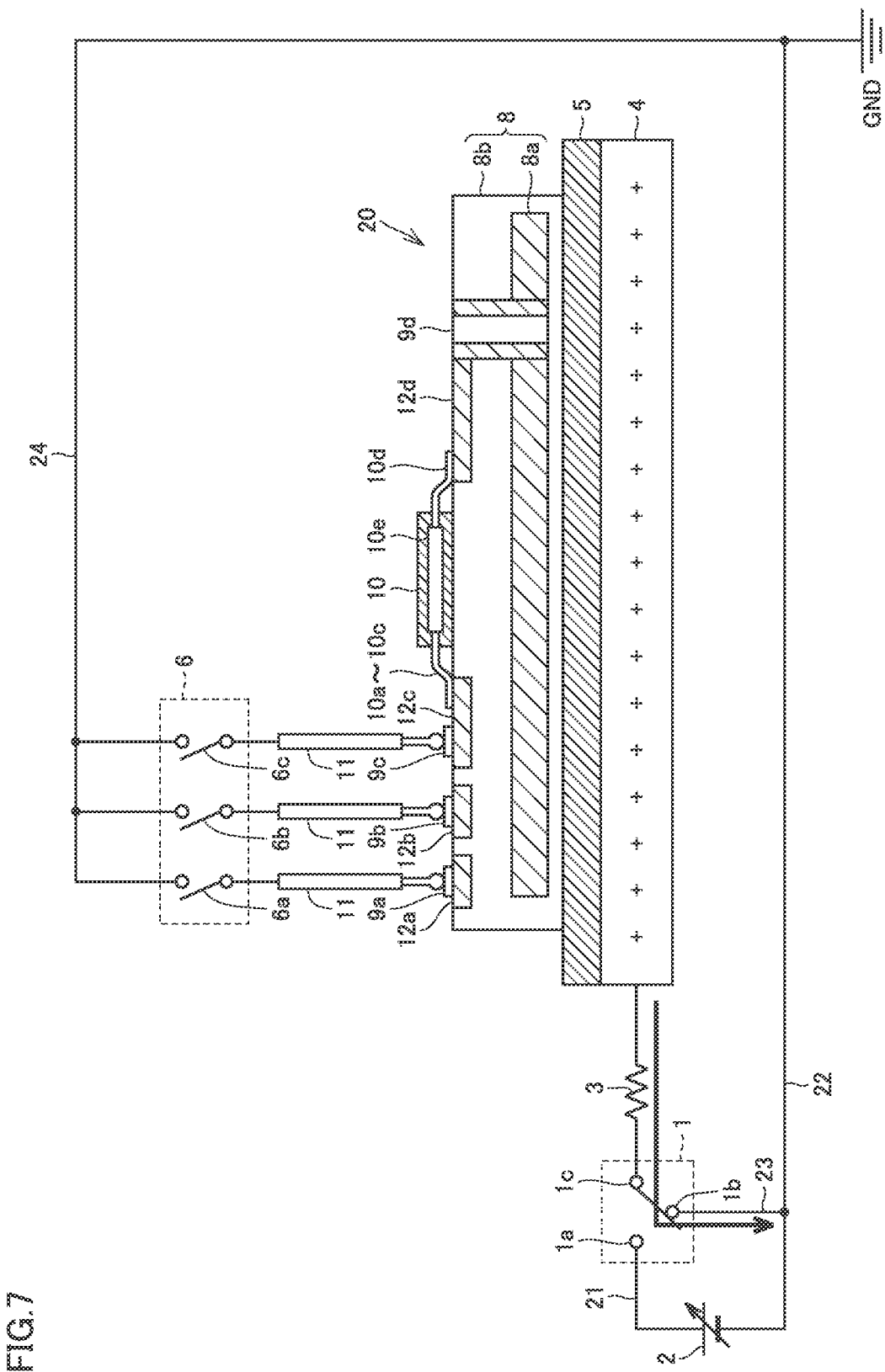
FIG. 7 is a diagram for explaining the step of removing electricity of a metal plate.

At the completion of electrostatic discharge, the step of removing electricity of metal plate 4 is performed. FIG. 7 is a diagram for explaining the step of removing electricity of metal plate 4.

In this step, as illustrated in FIG. 7, all of switches 6a to 6c of switch circuit 6 are turned off to electrically cut off pins 10a to 10c of semiconductor device 10 from GND. Then, contact 1b of switch 1 is turned on (that is, contact 1a is off).

Contact 1b is turned on to electrically connect metal plate 4 to GND through resistor 3, power line 23, and power line 22. The electric charge stored in metal plate 4 flows into GND via resistor 3, power line 23, and power line 22. After electricity of metal plate 4 is removed, probes 11a to 11c are operated such that the contact with terminals 9a to 9c is released. Thus, electrostatic withstand voltage test device 100 to the initial state.

(Failure Determination Method for Semiconductor Device)

A method of determining a failure of semiconductor device 10 in the electrostatic withstand voltage test according to the first embodiment will now be described.

Figure 8:
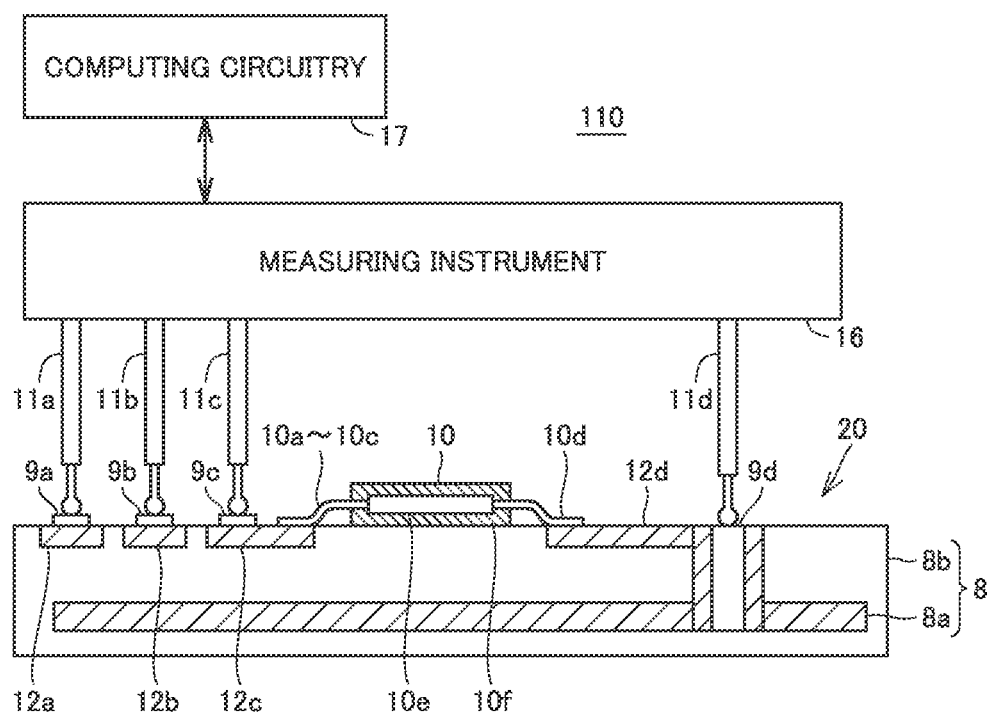
FIG. 8 is a diagram illustrating a configuration example of a measuring device for measuring electrical characteristics of a semiconductor device.

The failure determination of semiconductor device 10 is performed based on the result of electrical in measurement of semiconductor device 10 carried out before and after an electrostatic discharge. FIG. 8 is a diagram illustrating a configuration example of a measuring device for measuring electrical characteristics of semiconductor device 10.

As illustrated in FIG. 8, a measuring device 110 for measuring the electrical characteristics of semiconductor device 10 includes a measuring instrument 16, a computing circuitry 17, and a plurality of probes 11a to 11d. For example, a spring probe can be employed as probe 11.

The first terminals of a plurality of probes 11a to 11d are connected to measuring instrument 16. The second terminals of a plurality of probes 11a to 11c are connected to a plurality of, terminals 9a to 9c of semiconductor apparatus 20, respectively. The second terminal of a plurality of probe 11d is connected to a GND terminal 9d of semiconductor apparatus 20. In the example in FIG. 8, the number of probes 11 is four, but the number of probes 11 may be any number more than one.

Measuring instrument 16 is a unit for measuring the electrical characteristics of semiconductor device 10 and has, for example, a curve tracer with a voltage source or current source. Measuring instrument 16 is configured to measure a voltage between the terminals of semiconductor device 10 and a current flowing though semiconductor device 10.

Probes 11a to 11d are operated using a not-illustrated driver, so that probes 11a to 11d are brought into contact with terminals 9a a 9d of semiconductor apparatus 20, respectively, as illustrated in FIG. 8. With probes 11a to 11d brought into contact, measuring instrument 16 is electrically connected to pins 10a to 10d of semiconductor device 10 through probes 11a to 11d and terminals 9a to 9d.

Computing circuitry 17 is connected to measuring instrument 16 and accepts the measurement values of terminal-to-terminal voltage and current of semiconductor device 10 by measuring instrument 16. Computing circuitry 17 determines whether semiconductor device 10 is failed, based on the measurement values.

Specifically, before and after an electrostatic discharge is carried out, the electrical characteristics of semiconductor device 10 are measured using measuring instrument 16, and the measurement values of electrical characteristics before and after an electrostatic discharge is carried out are compared in computing circuitry 17. When semiconductor device 10 fails due to the electrostatic discharge, the resistance value of semiconductor device 10 changes. For example, when semiconductor device 10 has an open circuit fault, the resistance value of semiconductor device 10 increases and current does not flow even with application of a voltage. On the other band, when semiconductor device 10 has a short circuit fault, the resistance value of semiconductor device 10 decreases and current flows at once with application of a voltage. Therefore, it can be determined that semiconductor device 10 fails if a change is observed in measurement values of electrical characteristics of semiconductor device 10 before and after the electrostatic withstand voltage test is carried out.

(Electrostatic Withstand Voltage Test Flow)

Figure 9:
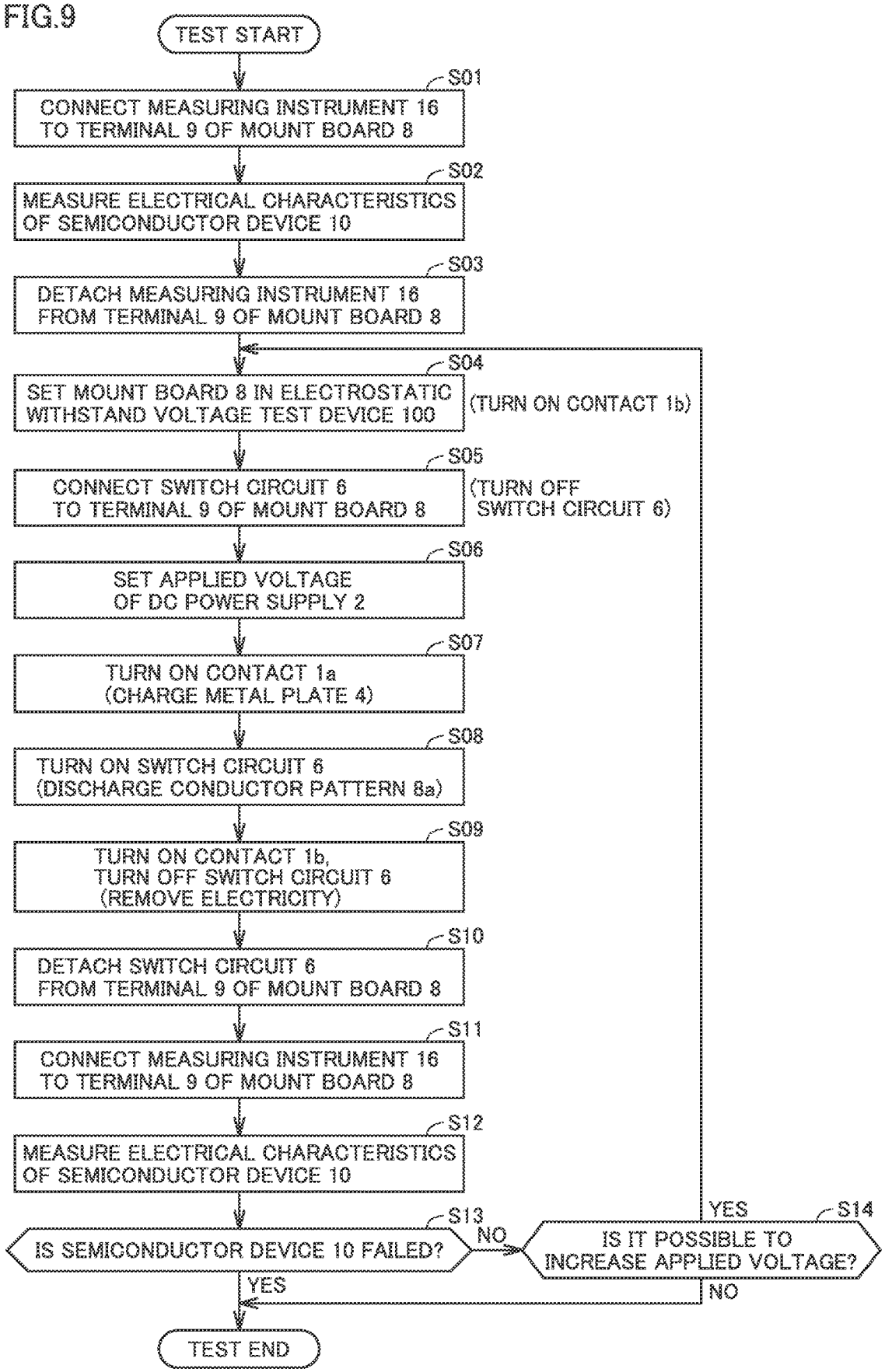
FIG. 9 is a flowchart for explaining the process flow of an electrostatic withstand voltage test method according to the first embodiment.

FIG. 9 is a flowchart for explaining the process flow of the electrostatic withstand voltage test method according to the first embodiment.

As illustrated in FIG. 9, the electrostatic withstand voltage test method according to the first embodiment includes a step of measuring the electrical characteristics of semiconductor device 10 before an electrostatic discharge occurs, a step of causing an electrostatic discharge, and a step of measuring the electrical characteristics of semiconductor device 10 after an electrostatic discharge occurs.

In the step of measuring the electrical characteristics of semiconductor device 10 before an electrostatic discharge occurs, the electrical characteristics (first electrical characteristics) of semiconductor device 10 are measured using measuring device 110 illustrated in FIG. 8.

Specifically, first, at step S01, measuring instrument 16 is connected to terminals 9a to 9d of semiconductor apparatus 20. At step S01, probe 11a to 11d are brought into contact with terminals 9a to 9d, respectively.

Then, at step S02, the electrical characteristics of semiconductor device 10 are measured. At step S02, at least one of switches 6a to 6c of switch circuit 6 and switch 6d are turned on, and a voltage and/or current is applied from measuring instrument 16 to semiconductor device 10. The measurement values of electrical characteristics of semiconductor device 10 by measuring instrument 16 are sent to computing circuitry 17. Computing circuitry 17 stores the measurement values of electrical characteristics of semiconductor device 10 into a memory as initial characteristics.

When the measurement of the electrical characteristics of semiconductor device 10 is finished, at step S03, probes 11a to 11d are operated to release the contact with terminals 9a to 9d, thereby detaching measuring instrument 16 from terminals 9a to 9d.

Then, in the step of causing an electrostatic discharge, an electrostatic discharge due to charge board event (CBE) is caused in semiconductor device 10 using electrostatic withstand voltage test device 100 illustrated in FIG. 3.

Specifically, first, at step S04 semiconductor apparatus 20 to be tested is set in electrostatic withstand voltage test device 100 set to the initial state. At step S04, mount board 8 is set on insulator 5. Since electrostatic withstand voltage test device 100 is in the initial state, contact 1b of switch 1 is turned on.

Then, at step S05, probes 11a to 11c are operated so that probes 11a to 11c are brought into contact with terminals 9a to 9c of semiconductor apparatus 20, respectively, as illustrated in FIG. 5. Thus, terminals 9a to 9c are electrically connected to switches 6a to 6c of switch circuit 6, respectively. However, since switches 6a to 6c all are in the off state, terminals 9a to 9c are electrically cut off from power line 24 (that is, GND).

Next at step S06, a voltage to be supplied from DC power supply 2 to power line 21 is set. This voltage is a voltage to be applied to metal plate 4.

When the applied voltage from DC power supply 2 is set, at step S07, contact 1a of switch 1 is turned on (that is, contact 1b is off). When contact 1a is turned on, a voltage supplied from DC power supply 2 to power line 21 is applied to metal plate 4 through switch 1 and resistor 3. As a result, as illustrated in FIG. 5, a positive charge is stored in metal plate 4, and conductor pattern 8a is charged.

Then, the process proceeds to step S08, and while contact 1a of switch 1 is kept in the on state, at least one of switches 6a to 6c of switch circuit 6 is turned on. At this moment, since two or more switches are simultaneously turned on to electrically connect two or more pins among pins 10a to 10c of semiconductor device 10 to GND simultaneously, a plurality of electrical paths via semiconductor device 10 are formed between conductor pattern 8a and GND. Electric charge 12 stored in conductor pattern 8a flows into semiconductor device 10 and flows into GND through these electrical paths.

Then, at step S09, all of switches 6a to 6c of switch circuit 6 are turned off to electrically cut off pins 10a to 10c of semiconductor device 10 from GND. Further, contact 1b of switch 1 is turned on (that is, contact 1a is off). When contact 1b is turned on, the electric charge stored in metal plate 4 flows into GND via resistor 3, power line 23, and power line 22.

After electricity of metal plate 4 is removed, at step S10, probes 11a to 11c are operated to release the contact with terminals 9a to 9c, thereby detaching switch circuit 6 from terminals 9a to 9c.

Then, in the step of measuring the electrical characteristics of semiconductor device 10 after an electrostatic discharge occurs, the electrical characteristics (second electrical characteristics) of semiconductor device 10 are measured again using measuring device 110 illustrated in FIG. 8.

Specifically, first, at step S11, measuring instrument 16 is connected to terminals 9a to 9d of semiconductor apparatus 20. At step S11, probes 11a to 11d are brought into contact with terminals 9a to 9d, respectively.

Then, at step S12, the electrical characteristics of semiconductor device 10 are measured. The process at step S12 is the same as the process at step S02. That is, at least one of switches 6a to 6c of switch circuit 6 and switch 6d are turned on, and a voltage and/or current is applied from measuring instrument 16 to semiconductor device 10.

Computing circuitry 17 acquires the measurement values of electrical characteristics of semiconductor device 10 from measuring instrument 16, and proceeds to step S13 and compares the electrical characteristics (second electrical characteristics) acquired at step S12 with the initial characteristics (first electrical characteristics) acquired at step S02 to determine whether semiconductor device 10 is failed.

If it is determined that semiconductor device 10 is failed (YES at S13), the electrostatic withstand voltage test is terminated. On the other hand, if it is determined that semiconductor device 10 is not failed (that is, normal) (NO at S13), computing circuitry 17 proceeds to step S14 and determines whether it is possible to further increase the applied voltage from DC power supply 2. At step S14, if the applied voltage at present has reached the upper limit of a voltage range that can be output by DC power supply 2, it is determined that it is impossible to increase the applied voltage. If it is impossible to increase the applied voltage (NO at S14), the electrostatic withstand voltage test is terminated.

On the other hand, if the applied voltage at present has not reached the upper limit (YES at S14), computing circuitry 17 determines that it is possible to increase the applied voltage, and returns to step S04 to perform the step of causing an electrostatic discharge again. In this step, at step S06, the applied voltage is changed to a voltage value higher than the voltage value at present. Then, the process at steps S07 to S10 is performed to cause an electrostatic discharge in semiconductor device 10. Subsequently, the process at steps S11 to S14 is performed to measure the electrical characteristics of semiconductor device 10 and determine whether semiconductor device 10 is failed based on the comparison between the measurement values and the initial characteristics.

As explained above, in the electrostatic withstand voltage test device and the electrostatic withstand voltage test method according to the first embodiment, since an electrostatic discharge can be caused simultaneously at a plurality of terminals 9 provided on mount board 8 of semiconductor apparatus 20, the electrostatic withstand voltage can be measured in the step of causing an electrostatic discharge by bringing metal into contact with a plurality of terminals 9 simultaneously, in the same manner as when the connector is inserted into a plurality of terminals 9. With this, the electrostatic withstand voltage of semiconductor device 10 on mount board 8 can be accurately measured.

Further, in the electrostatic withstand voltage test device and the electrostatic withstand voltage test method according to the first embodiment, since the path of electrostatic discharge is controlled by switch circuit 6, an electrostatic discharge can be caused at terminal 9 selected among a plurality of terminals 9. With this, the electrostatic withstand voltage can be measured based on change in manner of contact of each terminal 9 when the connector is inserted into a plurality of terminals 9.

In addition, since an electrostatic discharge is caused by the on/off of a plurality of switches 6a to 6c in switch circuit 6, the influence of surrounding environment can be suppressed, and consequently, a highly reproducible electrostatic withstand voltage test can be performed.

Second Embodiment

In the foregoing first embodiment, a configuration example in which electrostatic withstand voltage test device 100 and measuring device 110 are separate has been described. However, the electrostatic withstand voltage test device and the measuring device may be integrated. In this configuration, the electrostatic withstand voltage test device and the measuring device can be selectively driven using a switch.

(Configuration Example of Electrostatic Withstand Voltage Test Device)

Figure 10:
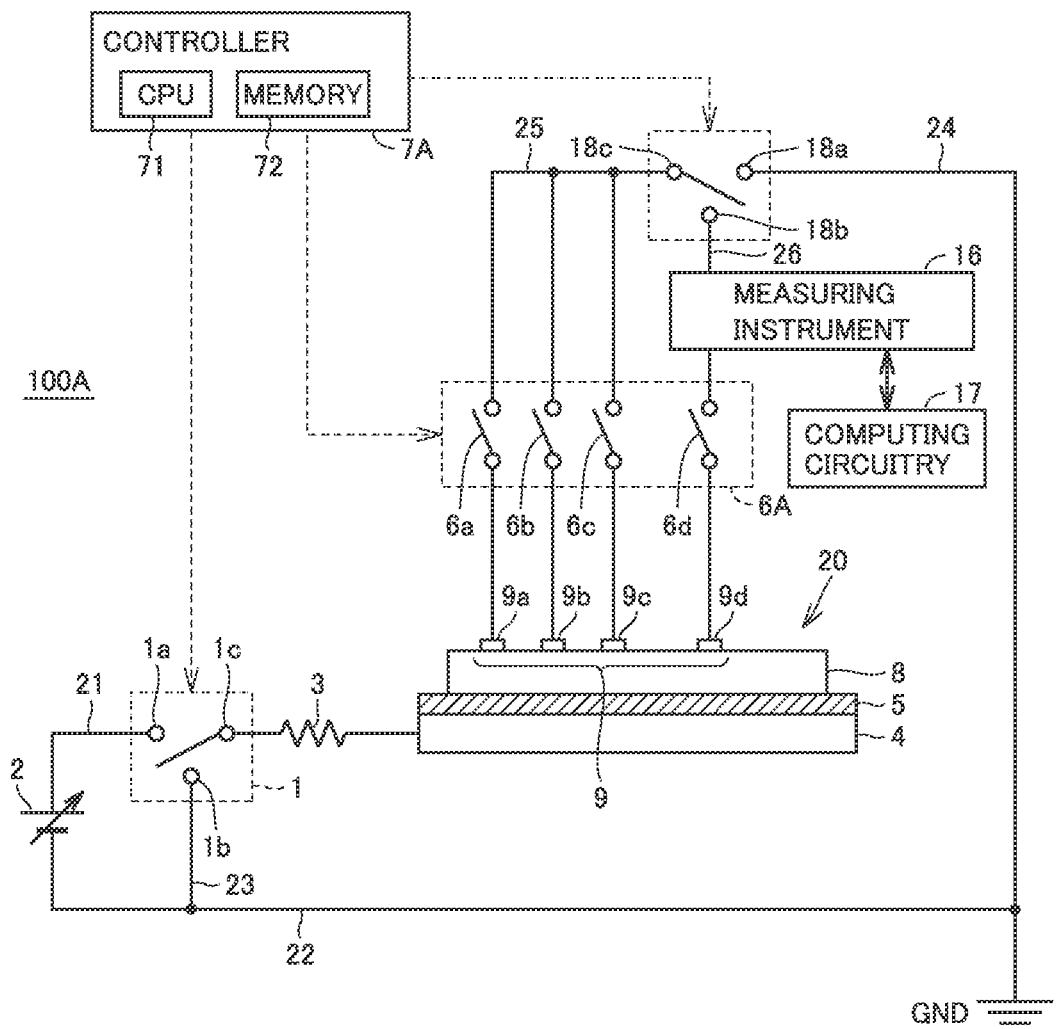
FIG. 10 is a diagram schematically illustrating a configuration example of an electrostatic withstand voltage test device according to a second embodiment.

FIG. 10 is a diagram schematically illustrating a configuration example of an electrostatic withstand voltage test device according to a second embodiment.

As illustrated in FIG. 10, in an electrostatic withstand voltage test device 100A according to the second embodiment, measuring instrument 16, computing circuitry 17, and a switch 18 are added to electrostatic withstand voltage test device 100 according to the first embodiment illustrated in FIG. 3, and switch circuit 6 and controller 7 are replaced by a switch circuit 6A and a controller 7A, respectively. In electrostatic withstand voltage test device 100A, measuring instrument 16 and computing circuitry 17 are the same as measuring instrument 16 and computing circuitry 17, respectively, in measuring device 110 illustrated in FIG. 8 and will not be further elaborated.

Switch 18 is connected between power line 25, 26 and power line 24. A semiconductor switch or a mechanical switch can be employed as switch 18. Switch 18 corresponds to an embodiment of "third switch".

Switch 18 is configured to electrically connect power line 25 to one of power line 24 and power line 26, in accordance with a control signal from controller 7A. As an example, switch 18 has three contacts 18a to 18c. Contacts 18a and 18b are fixed contacts, and contact 18a is a movable contact selectively connecting to contacts 18a and 18b. Contact 18a is connected to a first terminal of power line 25, contact 18a is connected to a first terminal of power line 24, and contact 18b is connected to a first terminal of power line 26. A second terminal of power line 25 is connected to first terminals of switches 6a to 6c of switch circuit 6A. A second terminal of power line 26 is connected to measuring instrument 16.

Switch circuit 6A is connected between terminal 9 of semiconductor apparatus 20 and power line 25 and measuring instrument 16. Switch circuit 6A is formed by adding a switch 6d to switch circuit 6 illustrated in FIG. 3. Switch 6d is connected between GND terminal 9d and measuring instrument 16. A semiconductor switch or a mechanical switch can be employed as switch 6d. Switch 6d turns on off in accordance with a control signal from controller 7A to electrically connect/cut off GND terminal 9d and measuring instrument 16.

Connecting contact 18c of switch 18 to contact 18a allows power line 25 and power line 24 to be electrically connected, thereby forming electrostatic withstand voltage test device 100 illustrated in FIG. 3. On the other hand, connecting contact 18c of switch 18 to contact 18b allows power line 25 and power line 26 to be electrically connected, so that terminals 9a to 9c of semiconductor apparatus 20 are connected to measuring instrument 16 through switches 6a to 6c. Thus, measuring device 110 illustrated in FIG. 8 can be formed. That is, electrostatic withstand voltage test device 100A is configured such that electrostatic withstand voltage test device 100 and measuring device 110 can be switched.

In the following description, connecting contact 18c to contact 18a may be referred to as "contact 18a is turned on", and connecting contact 18c to contact 18b may be referred to as "contact 18b is turned on". In switch 18, when contact 18a is on, contact 18b is turned off, and when contact 18b is on contact 18a is turned off.

Controller 7A controls the on/off of switches 1 and 18 and switch circuit 6A. Controller 7A can be composed of, for example, a microcomputer. Specifically, controller 7 includes a CPU 71 and a memory 72 for storing a program and data and can perform a control operation described later by software processing by CPU 71 executing the program. Alternatively, the control operation may be implemented partially or entirely by hardware processing using an embedded dedicated electronic circuit or the like, in place of the software processing.

Controller 7A can control the on/off of a plurality of switches 6a to 6c included in switch circuit 6, independently of each other, in the same manner as controller 7. Controller 7A therefore can turn on at least one of a plurality of switches 6a to 6c.

(Electrostatic Withstand Voltage Test Method)

Figure 11:
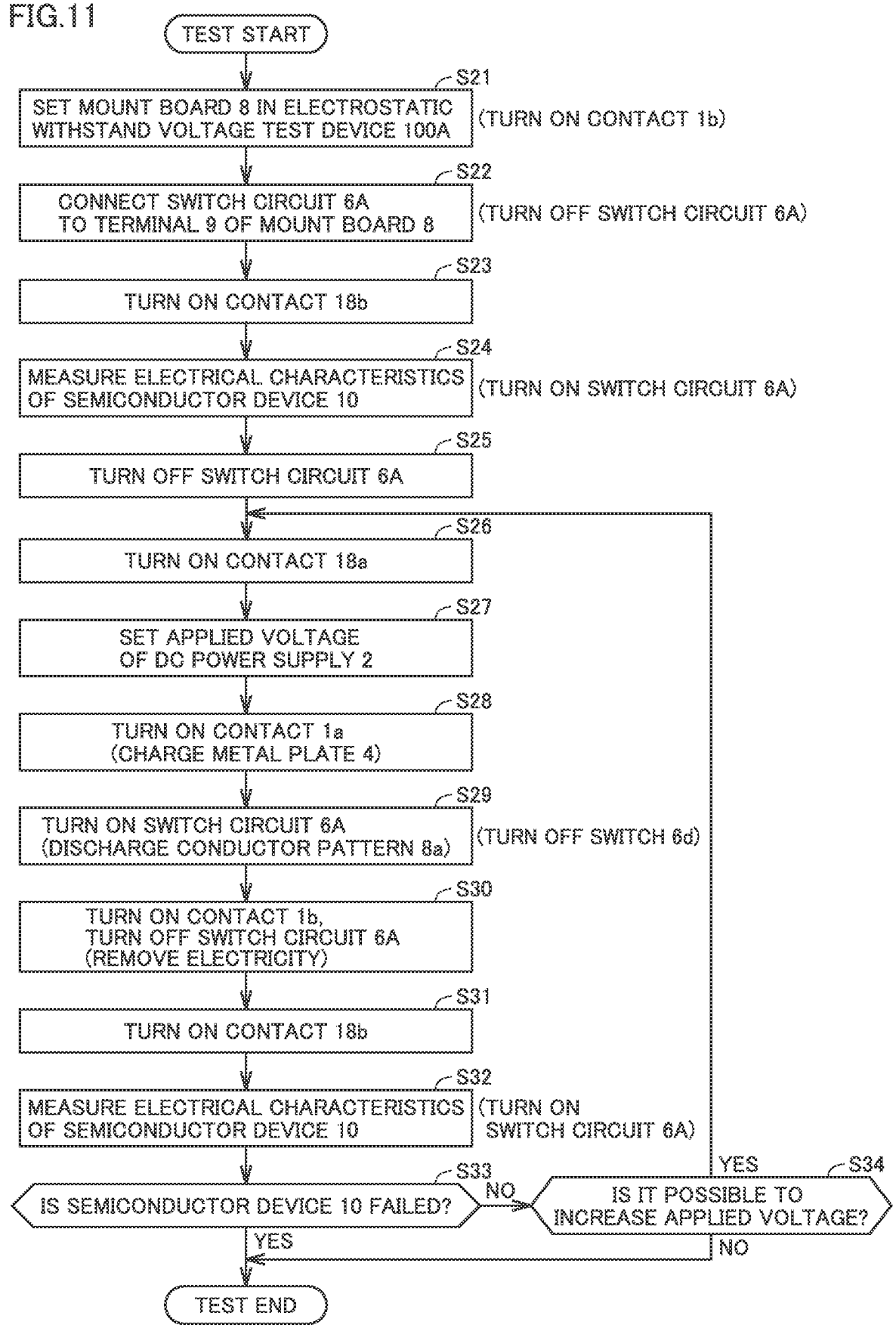
FIG. 11 is a flowchart for explaining the process flow of an electrostatic withstand voltage test method according to the second embodiment.
Figure 12:
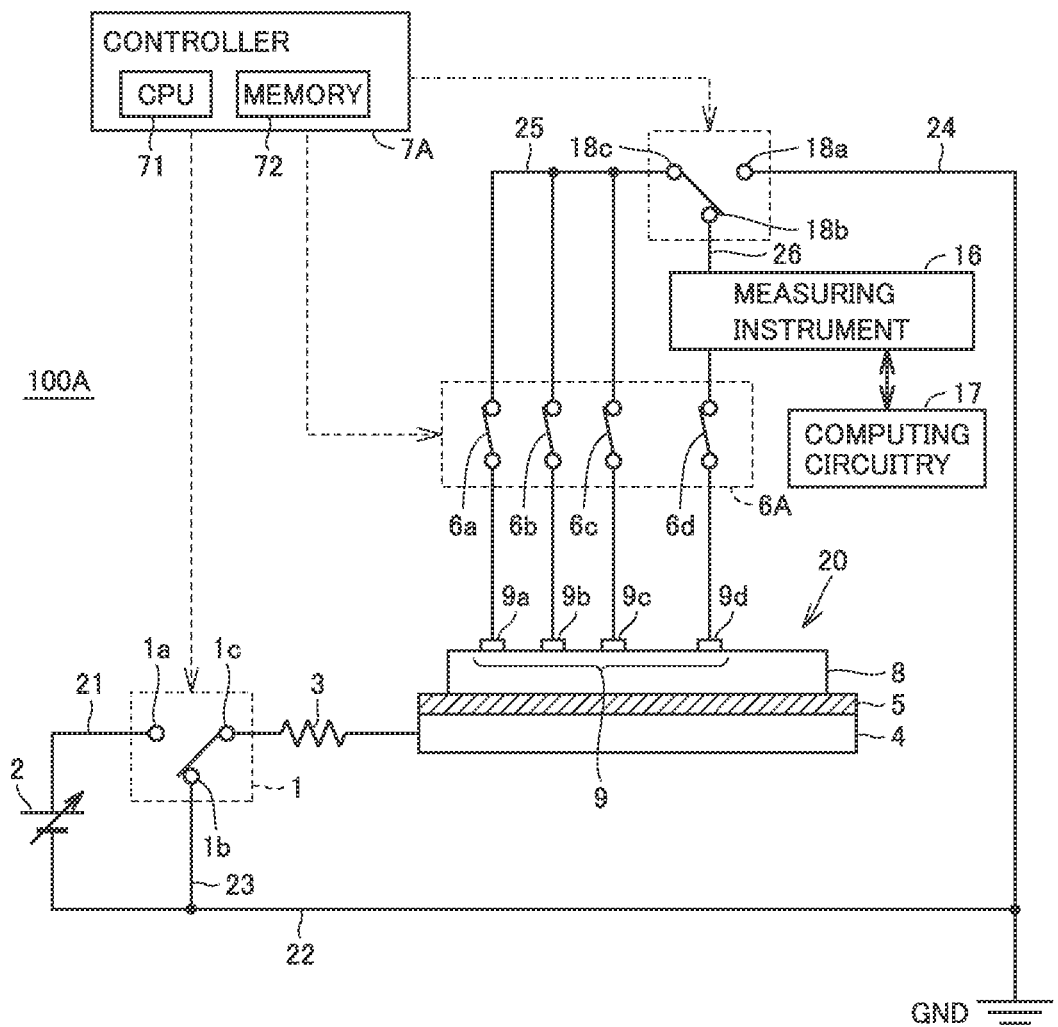
FIG. 12 is a diagram for explaining the step of measuring the electrical characteristics of a semiconductor device.
Figure 13:
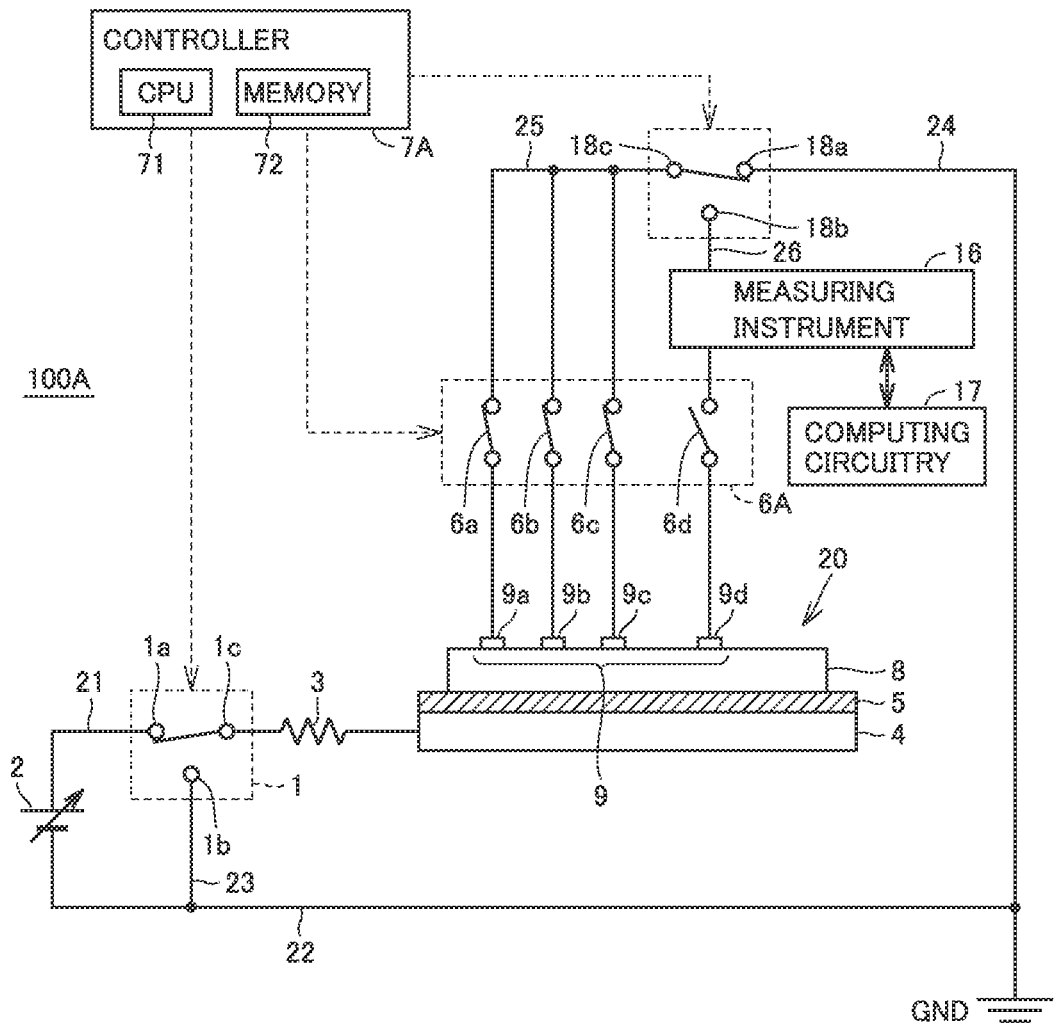
FIG. 13 is a diagram for explaining the step of causing an electrostatic discharge.

Referring to FIG. 11 to FIG. 13, an electrostatic withstand voltage test method according to the second embodiment will now be described. FIG. 11 is a flow chart for explaining the process flow of the electrostatic withstand voltage test method according to the second embodiment. The flowchart in FIG. 11 differs from the flowchart in FIG. 9 in control of switch 18 and switch circuit 6A.

As illustrated in FIG. 11, the electrostatic withstand voltage test method according to the second embodiment includes a step of measuring the electrical characteristics of semiconductor dev ice 10 before an electrostatic discharge occurs, a step of causing an electrostatic discharge, and a step of measuring the electrical characteristics of semiconductor device 10 after an electrostatic discharge occurs.

In the step of measuring the electrical characteristics of semiconductor device 10 before an electrostatic discharge occurs, the electrical characteristics (first electrical characteristics) of semiconductor device 10 are measured using measuring instrument 16 and computing circuitry 17 illustrated in FIG. 10. FIG. 12 is a diagram for explaining the step of measuring the electrical characteristics of semiconductor device 10.

Specifically, first, at step S21, semiconductor apparatus 20 to be tested is set in electrostatic withstand voltage test device 100A set to the initial state. In the initial state, contact 1b of switch 1 is turned on (that is contact 1a is off).

Then, at step S22, not-illustrated probes are brought into contact with terminals 9a to 9d of semiconductor apparatus 20 to electrically connect terminals 9a to 9d to switches 6a to 6d of switch circuit 6A, respectively. However, since switches 6a to 6d all are in the off state, terminals 9a to 9c are electrically cut off from power line 25, and GND terminal 9d is electrically cut off from measuring instrument 16.

At step S23, contact 18b of switch 18 is turned on (that is contact 18a is off). Then, at step S24, the electrical characteristics of semiconductor device 10 are measured. At step S24, at least one of switches 6a to 6c of switch circuit 6A and switch 6d are turned on, and a voltage and/or current is applied from measuring instrument 16 to semiconductor device 10. The measurement values of electrical characteristics of semiconductor device 10 by measuring instrument 16 are sent to computing circuitry 17. Computing circuitry 17 stores the measurement values of electrical characteristics of semiconductor device 10 into a memory as initial characteristics.

When the measurement of the electrical characteristics of semiconductor device 10 is finished, at step S25, all of switches 6a to 6d of switch circuit 6A are turned off.

Then, in the step of causing an electrostatic discharge, an electrostatic discharge due to charge board event (CBE) is caused in semiconductor device 10. FIG. 13 is a diagram for explaining the step of causing an electrostatic discharge.

Specifically, first, at step S26, contact 18a of switch 18 is turned on (that is, contact 18b is off). Contact 1b of switch 1 is kept on.

Then, at step S27, a voltage to be supplied from Dc power supply 2 to power line 21 is set. This voltage is a voltage to be applied to metal plate 4. When the applied voltage from DC supply 2 is set, at step S28, contact 1a of switch 1 is turned on (that is, contact 1b is off). When contact 1a is turned on, a voltage supplied from DC power supply 2 to power line 21 is applied to metal plate 4 through switch 1 and resistor 3.

Then, the process proceeds to step S29, and while contact 1a of switch 1 is kept in the on state, at least one of switches 6a to 6c of switch circuit 6A is turned on. Switch 6d is kept off. In the example in FIG. 13, switches 6a to 6c are turned on simultaneously. At step S29, since two or more switches among a plurality of switches 6a to 6c are simultaneously turned on to electrically connect two or more pins among pins 10a to 10c of semiconductor device 10 to GND simultaneously, a plurality of electrical paths via semiconductor device 10 are formed between conductor pattern 8a and GND. Electric charge 12 stored in conductor pattern 8a flows into semiconductor device 10 and flows into GND through these electrical paths.

Then, at step S30, all of switches 6a to 6c of switch circuit 6A are turned off to electrically cut off pins 10a to 10c of semiconductor device 10 from GND. Further, contact 1b of switch 1 is turned on (that is, contact 1a is off). When contact 1b is turned on, the electric charge stored in metal plate 4 flows into GND via resistor 3, power line 23, and power line 22.

Then, in the step of measuring the electrical characteristics of semiconductor device 10 after an electrostatic discharge occurs, the electrical characteristics (second electrical characteristics) of semiconductor device 10 are measured again using measuring instrument 16 and computing circuitry 17 illustrated in FIG. 10.

Specifically, first, at step S31, contact 18b of switch 18 is turned on (that is, contact 18a is off), and contact 1b of switch 1 is turned on (that is, contact 1a is off). All of switches 6a to 6d of switch circuit 6A are turned off.

Then, at step S32, the electrical characteristics (second electrical characteristics) of semiconductor device 10 are measured. The process at step S32 is the same as the process at step S24. That is, at least one of switches 6a to 6c of switch circuit 6A and switch 6d are turned on, and a voltage and/or current is applied from measuring instrument 16 to semiconductor device 10.

Computing circuitry 17 acquires the measurement values of electrical characteristics of semiconductor device 10 from measuring instrument 16, and then proceeds to step S33 and compares the electrical characteristics (second electrical characteristics) acquired at step S32 with the initial characteristics (first electrical characteristics) acquired at step S24 to determine whether semiconductor device 10 is failed.

If it is determined that semiconductor device 10 is failed (YES at S33), the electrostatic withstand voltage test is terminated. On the other hand, if it is determined that semiconductor device 10 is not failed (NO at S33), computing circuitry 17 proceeds to step S34 and determines whether it is possible to further increase the applied voltage from DC power supply 2. If it is impossible to increase the applied voltage (NO at S34), the electrostatic withstand voltage test is terminated.

On the other hand, if it is possible to increase the applied voltage (YES at S34), the process returns to step S26 and the step of causing an electrostatic discharge is performed again. In this step, at step S27, the applied voltage is changed to a voltage value higher than the voltage value at present. Then, the process at steps S28 to S30 is performed to cause an electrostatic discharge in semiconductor device 10. Subsequently, the process at steps S31 to S34 is performed to measure the electrical characteristics of semiconductor device 10 and determine whether semiconductor device 10 is failed based on the comparison between the measurement values and the initial characteristics.

As explained above, in the electrostatic withstand voltage test device and the electrostatic withstand voltage test method according to the second embodiment, since an electrostatic discharge can be caused simultaneously at a plurality of terminals 9 provided on mount board 8 of semiconductor apparatus 20 by controlling switches 6a to 6c of switch circuit 6A, effects similar to those in the electrostatic withstand voltage test device and the electrostatic withstand voltage test method according to the first embodiment can be achieved.

As for the foregoing embodiments and modifications, it is initially intended at the time of filing that the configurations described in the embodiments can be combined as appropriate, including any combinations that are not mentioned in the description, to an extent that does not cause inconvenience or contradiction Embodiments disclosed here should be understood as being illustrative rather than being limitative in all respects. The scope of the present disclosure is shown not in the foregoing description but in the claims, and it is intended that all modifications that come within the meaning and range of equivalence to the claims are embraced here.

REFERENCE SIGNS LIST 1, 6a to 6d, 18 switch, 1a to 1c, 18a to 18c contact, 2 DC power supply, 3 resistor, 4 metal plate, 5 insulator, 6, 6A switch circuit, 7, 7A controller, 8 mount board, 8a conductor pattern, 8b insulating layer, 9, 9a to 9d terminal, 10 semiconductor device, 10a to 10d pin, 10e semiconductor element, 10f scaling resin, 11, 11a to 11d probe, 12 electric charge, 12a to 12c wiring, 13 casing, 14 connector, 15 equipment, 16 measuring instrument, 17 computing circuitry, 20 semiconductor apparatus, 21 to 26 power line, 71 CPU, 72 memory, 100, 100A electrostatic withstand voltage test device, 110 measuring device.

The invention claimed is:

1. An electrostatic withstand voltage test device for measuring an electrostatic withstand voltage of a semiconductor device on a mount board, the semiconductor device having a plurality of pins, the mount board having a plurality of terminals electrically connected to the pins, respectively, and a conductor pattern, the electrostatic withstand voltage test device comprising:

a metal plate on which the mount board is installed;

a power supply to apply a voltage to the metal plate;

an insulator disposed between the metal plate and the mount board;

a switch circuit connected between the plurality of terminals and ground wiring; and a controller to control the switch circuit, wherein the switch circuit includes a plurality of first switches provided corresponding to the plurality of terminals, each of the plurality of first switches connecting a corresponding terminal to the ground wiring, and the controller is configured to turn on at least one first switch selected from the plurality of first switches when an electric charge stored in the conductor pattern is discharged to the ground wiring through the semiconductor device.

2. The electrostatic withstand voltage test device according to claim 1, further comprising:

a plurality of probes to connect the first switches to the terminals, and wherein each of the probes has a movable part having a tip end receiving a pressure to slide.

3. The electrostatic withstand voltage test device according to claim 1, wherein each of the first switches includes a mercury relay.

4. The electrostatic withstand voltage test device according to claim 1, further comprising:

a measuring instrument to measure electrical characteristics of the semiconductor device;

a computing circuitry to determine a failure of the semiconductor device, based on a measurement value of the electrical characteristics by the measuring instrument; and a third switch to selectively connect the switch circuit to the measuring instrument or the ground wiring, in accordance with a control signal from the controller.

5. An electrostatic withstand voltage test device for measuring an electrostatic withstand voltage of a semiconductor device on a mount board, the semiconductor device having a plurality of pins, the mount board having a plurality of terminals electrically connected to the pins, respectively, and a conductor pattern, the electrostatic withstand voltage test device comprising:

a metal plate on which the mount board is installed;

a power supply to apply a voltage to the metal plate;

an insulator disposed between the metal plate and the mount board;

a switch circuit connected between the terminals and ground wiring; and a controller to control the switch circuit, wherein the switch circuit includes a plurality of first switches provided corresponding to the terminals, each of the first switches connecting a corresponding terminal to the ground wiring, and the controller turns on at least one first switch selected from the first switches when an electric charge stored in the conductor pattern is discharged to the ground wiring through the semiconductor device;

a second switch to selectively connect the metal plate to the power supply or the ground wiring in accordance with a control signal from the controller, wherein the controller charges the conductor pattern by turning off the first switches and allowing the second switch to connect the metal plate to the power supply, discharges an electric charge stored in the conductor pattern to the ground wiring through the semiconductor device by turning on the at least one first switch, and removes electricity of the metal plate by turning off the at least one first switch and allowing the second switch to connect the metal plate to the ground wiring.

6. An electrostatic withstand voltage test method for measuring an electrostatic withstand voltage of a semiconductor device on a mount board, the semiconductor device having a plurality of pins, the mount board having a plurality of terminals electrically connected to the pins, respectively, and a conductor pattern, the electrostatic withstand voltage test method comprising:

causing an electrostatic discharge in the semiconductor device, the causing an electrostatic discharge in the semiconductor device including charging the conductor pattern by applying a voltage to a metal plate disposed to be opposed to the conductor pattern with an insulator interposed, and discharging an electric charge stored in the conductor pattern to ground wiring through the semiconductor device, the discharging including turning on at least one first switch selected from a plurality of first switches provided corresponding to the terminals and each connecting a corresponding terminal to the ground wiring.

7. The electrostatic withstand voltage test method according to claim 6, further comprising removing electricity of the metal plate by turning off the at least one first switch and connecting the metal plate to the ground wiring.

8. The electrostatic withstand voltage test method according to claim 6, wherein the causing an electrostatic discharge in the semiconductor device further includes bringing tip ends of a plurality of probes provided corresponding to the first switches into contact with the terminals.

9. The electrostatic withstand voltage test method according to claim 6, further comprising:

measuring first electrical characteristics of the semiconductor device before the causing an electrostatic discharge in the semiconductor device is performed;

measuring second electrical characteristics of the semiconductor device after the causing an electrostatic discharge in the semiconductor device is performed; and determining a failure of the semiconductor device by comparing the first electrical characteristics and the second electrical characteristics.

10. The electrostatic withstand voltage test method according to claim 9, wherein the causing an electrostatic discharge in the semiconductor device includes causing an electrostatic discharge again in the semiconductor device determined to be normal in the determining, and the causing an electrostatic discharge again includes increasing a voltage to be applied to the metal plate.

* * * * *